US012578390B2

(12) United States Patent　　　　(10) Patent No.:　US 12,578,390 B2
Ito et al.　　　　　　　　　　　　　(45) Date of Patent:　　Mar. 17, 2026

(54) LEAD-ACID BATTERY MONITORING DEVICE AND LEAD-ACID BATTERY MONITORING METHOD

(71) Applicant: GS Yuasa International Ltd., Kyoto (JP)

(72) Inventors: Hirokazu Ito, Kyoto (JP); Yuya Kihira, Kyoto (JP); Kazuo Haruki, Kyoto (JP); Ibuki Watano, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 568 days.

(21) Appl. No.: 17/927,437

(22) PCT Filed: May 13, 2021

(86) PCT No.: PCT/JP2021/018212
§ 371 (c)(1),
(2) Date: Nov. 23, 2022

(87) PCT Pub. No.: WO2021/241252
PCT Pub. Date: Dec. 2, 2021

(65) Prior Publication Data
US 2023/0176132 A1　　Jun. 8, 2023

(30) Foreign Application Priority Data
May 29, 2020　　(JP) ................................. 2020-093851

(51) Int. Cl.
*H01M 10/42*　　　　(2006.01)
*G01R 31/379*　　　　(2019.01)
(Continued)

(52) U.S. Cl.
CPC .........　*G01R 31/379* (2019.01); *G01R 31/396* (2019.01); *H01M 10/425* (2013.01);
(Continued)

(58) Field of Classification Search
CPC .. G01R 31/379; G01R 31/396; G01R 31/389; G01R 31/374; G01R 31/371;
(Continued)

(56) References Cited

U.S. PATENT DOCUMENTS

2014/0285156 A1　9/2014　Mukaitani et al.
2014/0306667 A1　10/2014　Mukaitani et al.
(Continued)

FOREIGN PATENT DOCUMENTS

CN　　　109818109　　*　5/2019
JP　　　H11283677　　*　10/1999
(Continued)

OTHER PUBLICATIONS

International Search Report and Written Opinion for International Application No. PCT/JP2021/018212, dated Jul. 20, 2021, (10 pages), Japan Patent Office, Tokyo, Japan.

*Primary Examiner* — Lisa S Park

(74) *Attorney, Agent, or Firm* — Alston & Bird LLP

(57)　　　　　　ABSTRACT

A lead-acid battery monitoring device includes a plurality of sensor units 20 attached to a plurality of lead-acid batteries 1 connected in series and/or in parallel and a control unit 10 that sequentially establishes wireless communication connection with the plurality of monitoring units 20. The lead-acid battery monitoring device executes a first monitoring operation in which the management unit 10 sequentially receives monitoring data including an internal resistance and a temperature of each lead-acid battery 1 from the plurality of monitoring units 20 and a second monitoring
(Continued)

System configuration operation in which the management unit 10 sequentially receives monitoring data including the temperature of each lead-acid battery 1 from the plurality of monitoring units 20.

8 Claims, 8 Drawing Sheets

(51) Int. Cl.
*G01R 31/389* (2019.01)
*G01R 31/396* (2019.01)
*H01M 10/48* (2006.01)

(52) U.S. Cl.
CPC ......... *H01M 10/486* (2013.01); *G01R 31/389* (2019.01); *H01M 2010/4278* (2013.01)

(58) Field of Classification Search
CPC G01R 31/392; H01M 10/425; H01M 10/486; H01M 2010/4278; H01M 10/482; H01M 2010/4271; H01M 10/48; Y02E 60/10; H02J 7/00; H02J 7/06; H02J 13/00
See application file for complete search history.

(56) References Cited

U.S. PATENT DOCUMENTS

| | | |
|---|---|---|
| 2014/0312915 A1 | 10/2014 | Mukaitani et al. |
| 2014/0379285 A1* | 12/2014 | Dempsey ............. G01R 31/371 |
| | | 702/63 |
| 2016/0233560 A1 | 8/2016 | Kanoh et al. |
| 2022/0137142 A1 | 5/2022 | Ito et al. |

FOREIGN PATENT DOCUMENTS

| | | | |
|---|---|---|---|
| JP | 2002-008731 A | | 1/2002 |
| JP | 4319477 B2 | | 8/2009 |
| JP | WO2014076839 | * | 1/2017 |
| JP | 6135767 B2 | | 5/2017 |
| JP | 2019-060774 A | | 4/2019 |
| JP | 2019-061870 A | | 4/2019 |
| JP | 2019-061872 A | | 4/2019 |
| JP | 2019-190939 A | | 10/2019 |
| JP | 2019-192562 A | | 10/2019 |
| JP | 2019190939 | * | 10/2019 |
| JP | 6690799 B1 | | 4/2020 |
| WO | WO-2013/069328 A1 | | 5/2013 |
| WO | WO2018170672 | * | 9/2018 |

* cited by examiner

System configuration

LEAD-ACID BATTERY MONITORING DEVICE AND LEAD-ACID BATTERY MONITORING METHOD

CROSS REFERENCE TO RELATED APPLICATIONS

This application is a National Stage Application, filed under 35 U.S.C. § 371, of International Application No. PCT/JP2021/018212, filed May 13, 2021, which international application claims priority to and the benefit of Japanese Application No. 2020-093851, filed May 29, 2020; the contents of both of which as are hereby incorporated by reference in their entireties.

BACKGROUND

Technical Field

The present invention relates to a lead-acid battery monitoring device and a lead-acid battery monitoring method.

Description of Related Art

Japanese Patent No. 6135767 discloses that in an energy storage system, a relay board is communicably connected to a higher power control device and each lower storage battery board.

BRIEF SUMMARY

One aspect of the present invention provides a lead-acid battery monitoring device and a lead-acid battery monitoring method.

A lead-acid battery monitoring device according to one aspect of the present invention includes a plurality of sensor units attached to a plurality of lead-acid batteries connected in series and/or in parallel and a control unit that sequentially establishes wireless communication connection with the plurality of monitoring units. The lead-acid battery monitoring device executes a first monitoring operation in which the management unit sequentially receives monitoring data including an internal resistance and a temperature of each lead-acid battery from the plurality of monitoring units and a second monitoring operation in which the management unit sequentially receives monitoring data (not including the internal resistance) including the temperature of each lead-acid battery from the plurality of monitoring units.

A lead-acid battery monitoring method according to another aspect of the present invention includes: sequentially wirelessly communicating with a plurality of monitoring units attached to a plurality of lead-acid batteries connected in series and/or in parallel using a management unit; executing a first monitoring operation in which the management unit sequentially receives monitoring data including an internal resistance and a temperature of each lead-acid battery from the plurality of monitoring units using the management unit; and executing a second monitoring operation in which the management unit sequentially receives monitoring data (not including the internal resistance) including the temperature of each lead-acid battery from the plurality of monitoring units using the management unit.

With the above configuration, the measurement frequency of the temperature that greatly affects the degradation and life of the lead-acid battery is increased while the measurement frequency of the internal resistance that requires the discharge of the lead-acid battery is prevented, so that the state of the lead-acid battery can be grasped with high accuracy.

DETAILED DESCRIPTION OF VARIOUS EMBODIMENTS

In an energy storage system, a large number of storage batteries are connected in series and/or in parallel. There is also a large-scale energy storage system including several hundred storage batteries. There is a growing need for remote monitoring of the individual storage battery in the large-scale energy storage system. In order to implement such storage battery monitoring, when a plurality of monitoring units attached to each of the storage batteries and a management unit that acquires data from the monitoring units are connected by wire, network laying cost increases.

There is a demand for a technique capable of implementing the remote monitoring of the storage battery while reducing wiring cost and communication cost.

Among short-range wireless communication standards, Bluetooth Low Energy (hereinafter, referred to as BLE) attracts attention in IoT applications. Wireless communication can be performed at low cost with the BLE.

Figure 1:
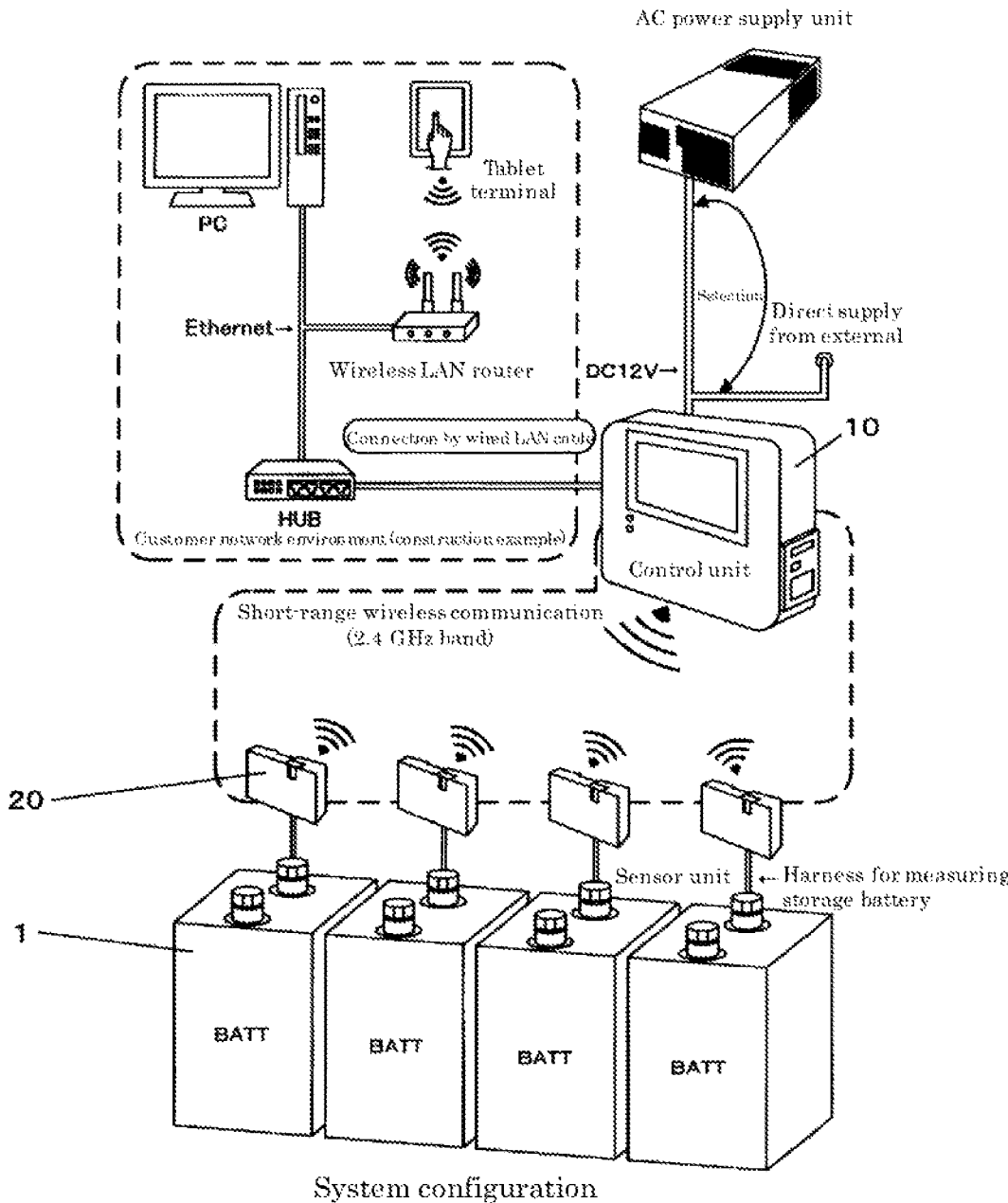
FIG. 1 is a view illustrating an outline of a storage battery monitoring device.

With reference to the drawings, an embodiment of a lead-acid battery monitoring device will be described below. The lead-acid battery monitoring device in FIG. 1 includes a plurality of sensor units (monitoring units) 20 attached to each of a plurality of lead-acid batteries 1 connected in series and/or in parallel and a control unit (management unit) 10 capable of wirelessly communicating with the plurality of sensor units 20.

Here, a plurality of lead-acid batteries 1 connected in series may be referred to as a bank, and a plurality of banks connected in parallel may be referred to as a domain.

The control unit 10 and the plurality of sensor units 20 may be installed in a storage battery board storing a plurality of lead-acid batteries that is a monitoring target. For example, the control unit 10 is attached to an inside of an opening and closing lid of the storage battery board. The plurality of sensor units 20 are installed on the plurality of lead-acid batteries 1 arranged in the storage battery board.

The control unit 10 has a web server function, and may receive access by a terminal such as a computer (PC) or a tablet connected to a network.

Figure 2:
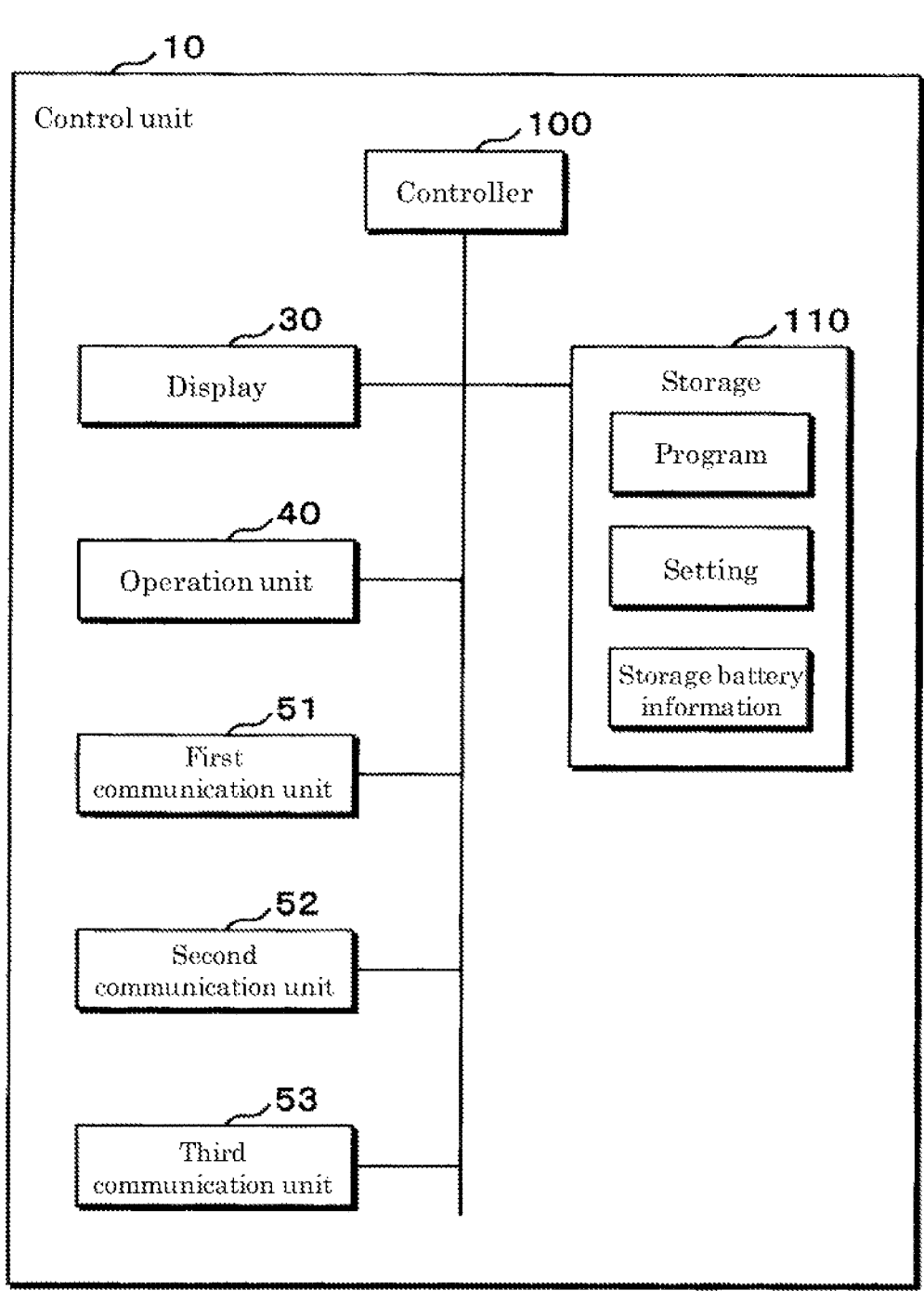
FIG. 2 is a block diagram illustrating a configuration of a control unit.

FIG. 2 is a block diagram illustrating a configuration of the control unit 10. The control unit 10 includes a controller 100, a storage 110, a display 30, an operation unit 40, a first communication unit 51, a second communication unit 52, and a third communication unit 53.

The controller 100 includes a processor, and controls the first communication unit 51, the second communication unit 52, and the third communication unit 53 based on a program stored in the storage 110.

The storage 110 uses a nonvolatile memory. The storage 110 previously stores a program. The storage 110 stores storage battery information acquired by the controller 100.

For example, the display 30 is a liquid crystal panel. The operation unit 40 is a touch panel built in the liquid crystal panel. The operation unit 40 may include a physical button.

The first communication unit 51 is a wireless communication module that implements wireless communication connection with the sensor unit 20. The control unit 10 is communicably connected to the plurality of sensor units 20 by the first communication unit 51. The first communication unit 51 implements communication by BLE. The second communication unit 52 is a connection module connecting to a network of a customer (a customer who owns the energy storage system such as a backup power supply by the lead-acid battery 1) in FIG. 1, and for example, is a network card corresponding to a wired LAN. The third communication unit 53 is a communication module that enables communication connection with a computer (PC) of a maintenance staff or a tablet terminal connected to a network. For example, the third communication unit 53 is a universal serial bus (USB). The third communication unit 53 may implement communication with the tablet terminal of the maintenance staff or the like by a wireless LAN.

Figure 3:
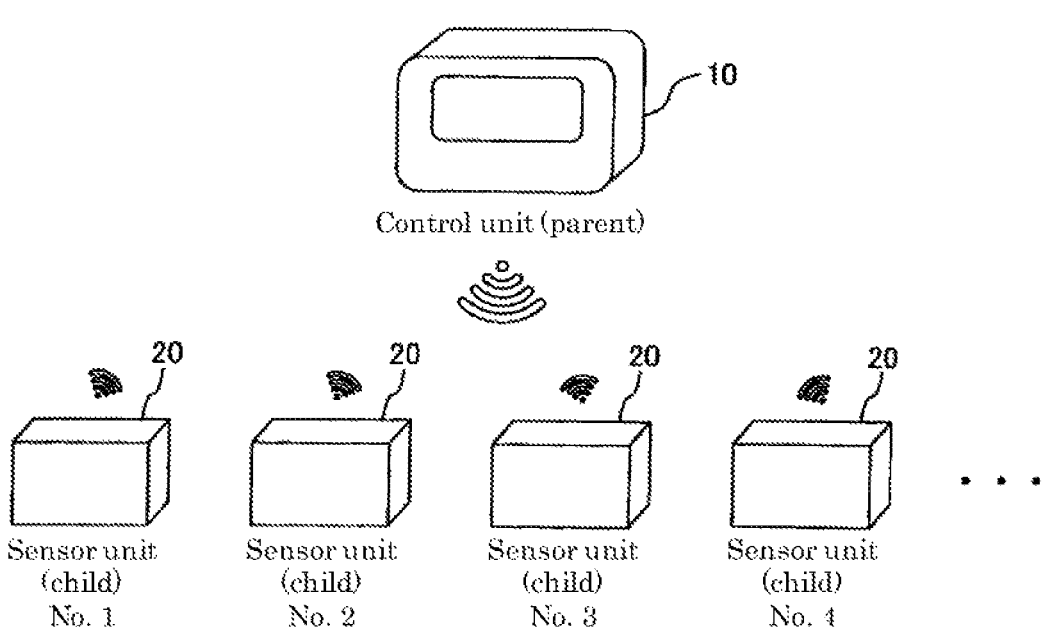
FIG. 3 is a schematic diagram illustrating communication between the control unit and a sensor unit.

FIG. 3 is a schematic diagram illustrating communication between the control unit 10 and the sensor unit 20. The message broadcasted from the control unit 10 to the plurality of sensor units 20 includes identification information about the specific sensor unit 20.

The message may include a MAC address storage and a message body. The identification information about the specific sensor unit 20 may be stored in the MAC address storage.

The control unit 10 has a web server function, and produces screen data for screen display including an icon representing an overall state of the plurality of lead-acid batteries 1.

Figure 4:
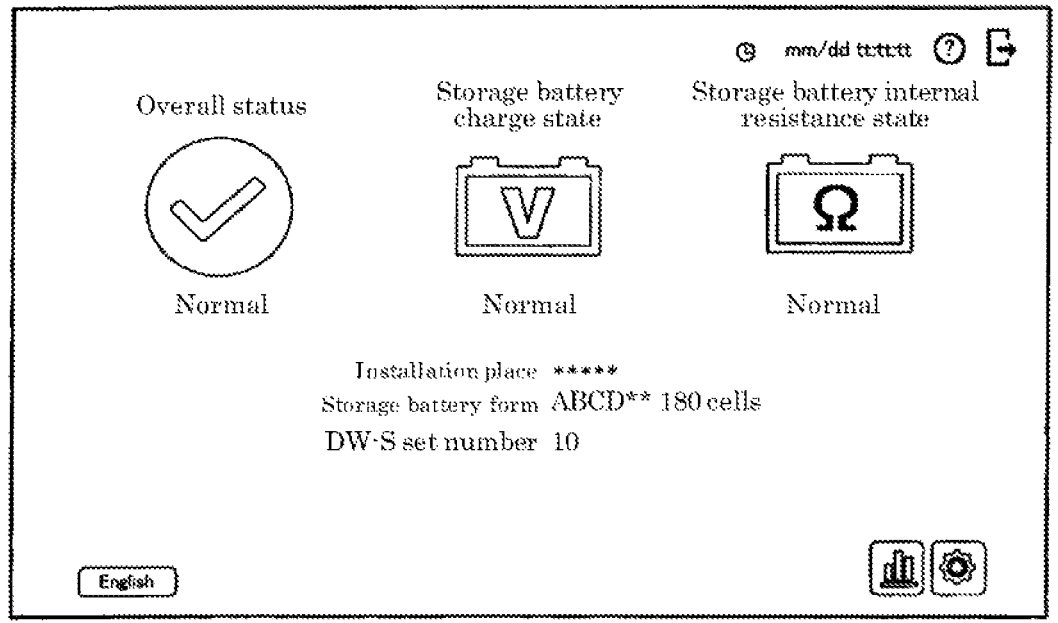
FIG. 4 is a view illustrating a remote monitoring screen on a web browser.

FIG. 4 illustrates an example of a remote monitoring screen displayed on a web browser terminal connected to the network of the control unit 10. The remote monitoring screen includes an icon for an overall status, an icon for a storage battery voltage state, and an icon for a storage battery internal resistance state.

In addition to the icon indicating "normal", an icon indicating "caution" or an icon indicating "warning" may be prepared as the icon for the overall status. Similarly, the icon indicating "caution" or "warning" may be prepared for the icon for the storage battery voltage state and the icon for the storage battery internal resistance state.

In the above-described lead-acid battery monitoring device, identification information about the specific sensor unit 20 is included in the message broadcasted from the control unit 10 to the plurality of sensor units 20, and the communication between the control unit 10 and the specific sensor unit 20 is established using the identification information.

Accordingly, even when several hundred sensor units 20 associated with several hundred lead-acid batteries 1 are provided as in the energy storage system having the storage battery group in the form of a domain including a plurality of banks, the control unit 10 can reliably acquire monitoring data sequentially from the sensor units 20.

In the lead-acid battery monitoring device, the sensor unit 20 and the control unit 10 are installed on the same storage battery board. The lead-acid battery monitoring device can be relatively easily attached (retrofitted) to an existing storage battery board in which the monitoring device is not included.

The sensor unit 20 wirelessly transmits the monitoring data of the voltage, internal resistance, and temperature of the lead-acid battery 1, to which the sensor unit 20 is connected, to the control unit 10. Thus, a state of health (SOH) of the lead-acid battery 1 can be monitored.

As described later, each sensor unit 20 measures the temperature of the lead-acid battery 1 to which the sensor unit is attached at a frequency higher than that of the internal resistance. Each sensor unit 20 executes a first monitoring operation of measuring the internal resistance and temperature of the lead-acid battery 1 to wirelessly transmit the measured internal resistance and temperature to the control unit 10 and a second monitoring operation of measuring the temperature of the lead-acid battery 1 to wirelessly transmit the measured temperature to the control unit 10.

The control unit 10 may determine the overall state by comparing the monitoring data (numerical data) of the plurality of lead-acid batteries 1 with a threshold or performing statistical processing.

The lead-acid battery 1 can be remotely monitored by a web browser of a terminal connected to the control unit 10 by LAN. The icon representing the overall state of the plurality of lead-acid batteries 1 facilitates a grasp of the state of the energy storage system.

Figure 5:
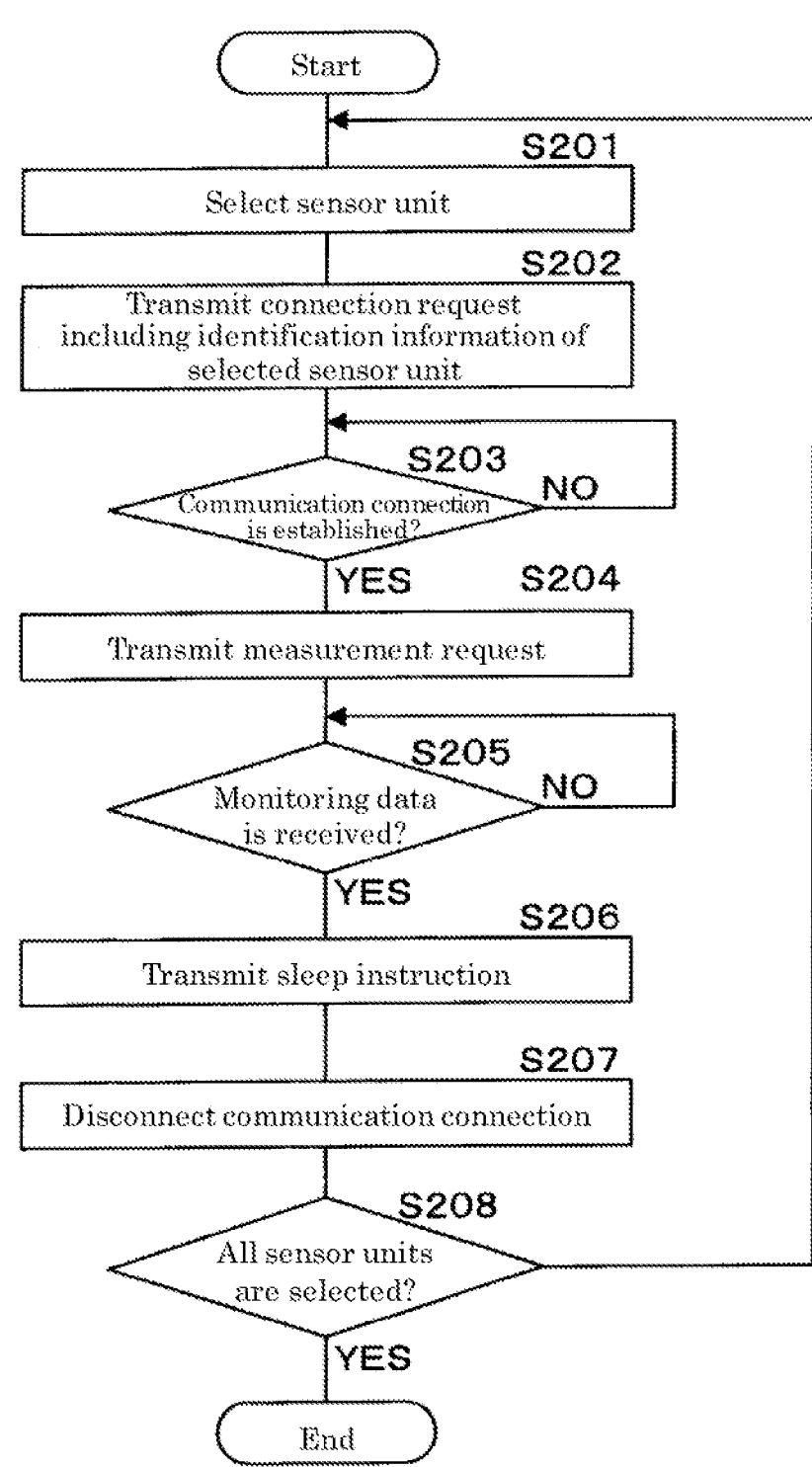
FIG. 5 is a flowchart illustrating an example of a processing procedure in the control unit.

FIG. 5 is a flowchart illustrating an example of a processing procedure in the control unit 10. The control unit 10 executes the following processing in units of banks at predetermined timing. The control unit 10 sequentially executes the processing for all the banks. The control unit 10 stores timing for executing the following processing and identification information about the sensor unit 20 of a connection target in an internal memory.

The control unit 10 selects one piece of identification information about the sensor unit 20 (step S201). The control unit 10 transmits a connection request message including the selected identification information by BLE (step S202), and determines whether a communication connection (pairing) with the sensor unit 20 of the selected identification information is established (step S203).

When it is determined in step S203 that the communication connection is established (YES in S203), the control unit 10 transmits a measurement request to the sensor unit 20 connected for communication (step S204), and determines whether the monitoring data obtained by the measurement in response to the measurement request can be received (step S205).

When it is determined that the monitoring data can be received (YES in S205), the control unit 10 transmits a sleep instruction to the sensor unit 20 connected for communication (step S206), disconnects the communication connection (step S207), and advances the processing to next step S208.

The control unit 10 determines whether the pieces of identification information about all the sensor units 20 included in the target bank are selected (step S208). When it is determined that not all the items are selected (NO in S208), the control unit 10 returns the processing to step S201, and selects the identification information about the next sensor unit 20.

When it is determined that all the banks are selected (YES in S208), the control unit 10 ends the pieces of processing for the banks.

When it is determined in step S203 that the communication connection is not established (NO in S203), the control unit 10 returns the processing to step S203 and stands by. The control unit 10 makes a trial a predetermined number of times in a predetermined standby time, and advances the processing to step S207 when the communication cannot be established.

When it is determined in step S205 that the reception cannot be performed (NO in S205), the control unit 10 returns the processing to step S205 and stands by. The control unit 10 makes a trial a predetermined number of times in a predetermined standby time, and advances the processing to step S207 when data cannot be received.

Figure 6:
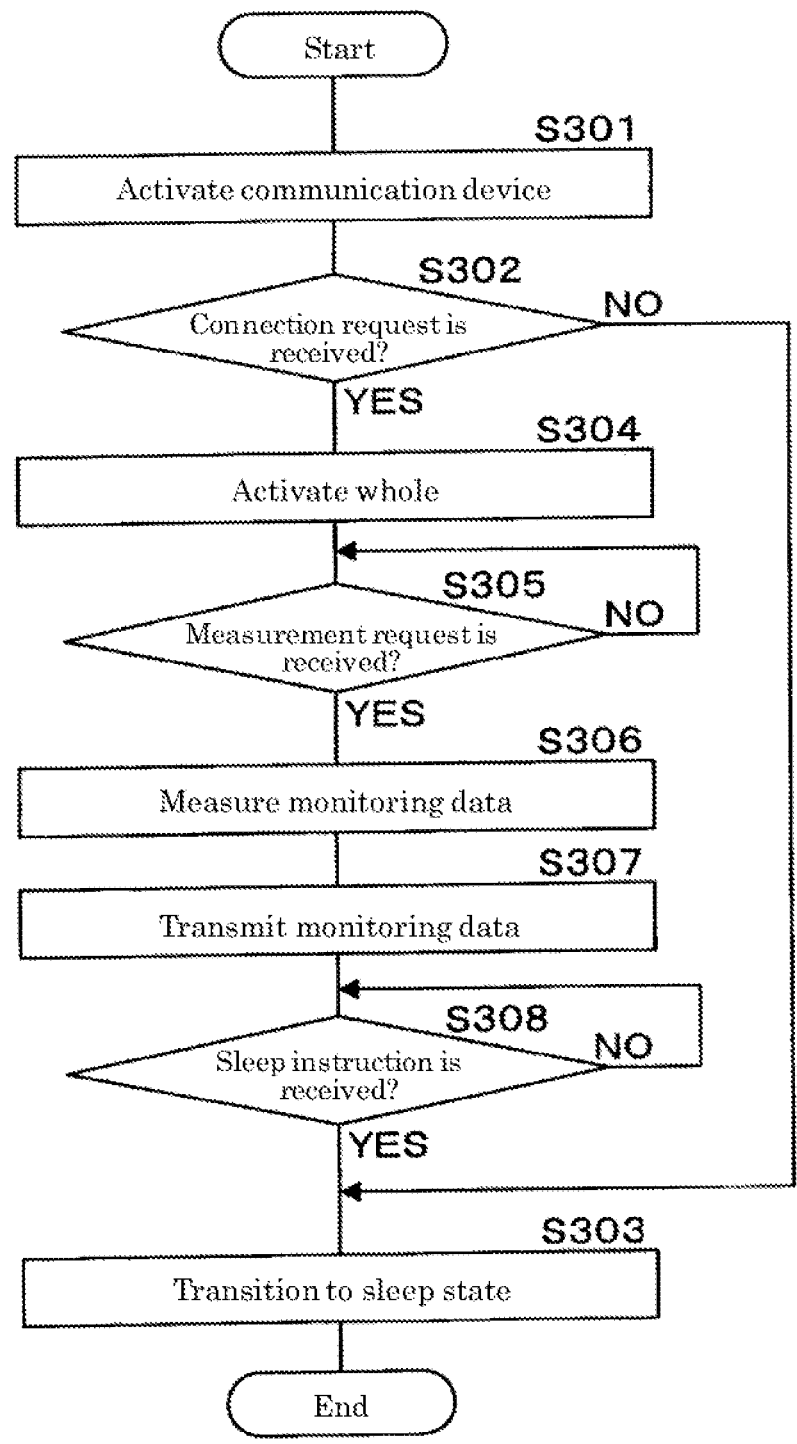
FIG. 6 is a flowchart illustrating an example of a processing procedure in the sensor unit.

FIG. 6 is a flowchart illustrating an example (first monitoring operation) of the processing procedure in the sensor unit 20. The sensor unit 20 activates the BLE communication device from the sleep state intermittently, for example, every two seconds or three seconds (step S301), and determines whether the connection request to itself is received (step S302).

When it is determined that the connection request is not received (NO in S302), the sensor unit 20 transitions to the sleep state again (step S303), and ends the processing.

When it is determined in step S302 that the connection request is received (YES in S302), the sensor unit 20 activates the whole (step S304), and determines whether the measurement request is received (step S305). When it is determined that the measurement request is received (YES in S305), the sensor unit 20 measures the monitoring data of the voltage, the internal resistance, and the temperature in the lead-acid battery to which the own device is attached (step S306). The sensor unit 20 transmits the monitoring data obtained by the measurement to the control unit 10 as a response to the measurement request (step S307).

The sensor unit 20 determines whether the sleep instruction is received (step S308). When it is determined that the sleep instruction is received, the sensor unit 20 transitions to the sleep state (step S303), and ends the processing.

When it is determined in step S305 that the measurement request is not received (NO in S305), the sensor unit 20 returns the processing to step S305 and stands by. The sensor unit 20 makes a trial a predetermined number of times in a predetermined standby time, and advances the processing to step S303 when the measurement request cannot be received.

When it is determined in step S308 that the sleep instruction is not received (NO in S308), the sensor unit 20 returns the processing to step S308 and stands by. The sensor unit 20 makes a trial a predetermined number of times in a predetermined standby time, and advances the processing to step S303 when the sleep instruction cannot be received.

In summary, the lead-acid battery monitoring device illustrated in FIGS. 5 and 6 executes the following operations.

The control unit 10 sequentially selects the pieces of identification information about the plurality of sensor units 20 previously stored, and transmits the connection request message including the identification information about the selected sensor unit 20 to the plurality of sensor units 20 in order to establish the communication with the selected sensor unit 20, and transmits the measurement request of the monitoring data to the sensor unit 20 in which the communication is established.

Each of the plurality of sensor units 20 is intermittently activated for wireless communication with the control unit 10 from the sleep state to determine whether the connection request message including the identification information about the own sensor unit is received. When the connection request message is not received, the sensor unit 20 transitions to the sleep state. When the connection request message is received, the sensor unit 20 measures the monitoring data of the lead-acid battery to which the sensor unit 20 is connected in response to the reception of the measurement request, wirelessly transmits the measured monitoring data to the control unit 10, and transitions to the sleep state. When the sleep instruction is received from the control unit 10 or when the communication connection with the control unit 10 is disconnected, the sensor unit 20 transitions to the sleep state.

Figure 7:
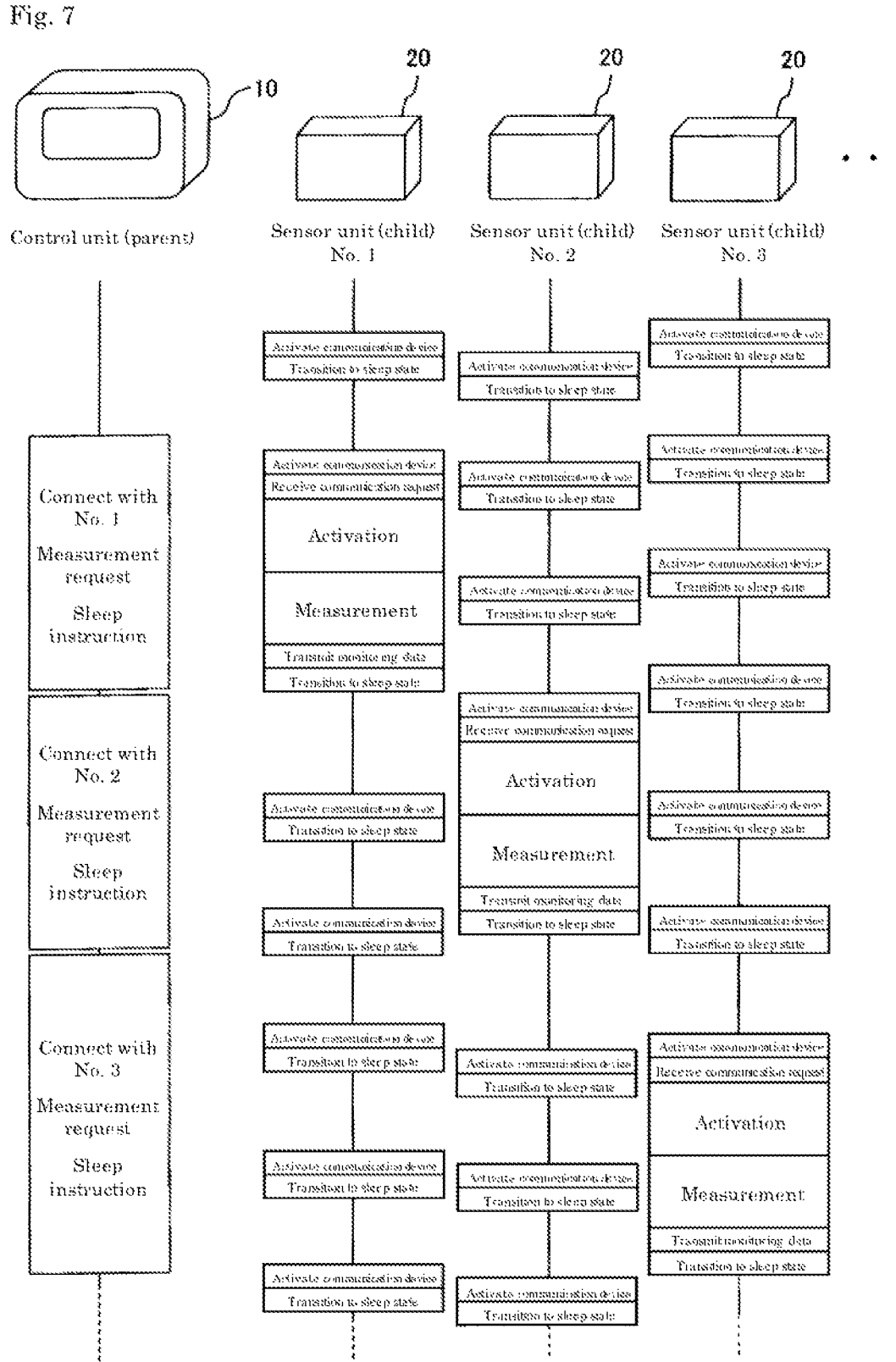
FIG. 7 is a schematic diagram illustrating a communication procedure.

FIG. 7 is a schematic diagram illustrating the communication procedure during the first monitoring operation. For example, the first monitoring operation is performed once a day. FIG. 7 illustrates an activation time in the sensor unit 20 by the control unit 10 executing the procedure illustrated in the flowchart of FIG. 5 and the sensor unit 20 accordingly executing the procedure illustrated in the flowchart of FIG. 6. As illustrated in FIG. 7, the sensor unit 20 intermittently determines whether the connection request can be received by the communication device of BLE, measures the monitoring data (voltage, internal resistance, temperature) of the lead-acid battery 1 to which the sensor unit is attached only when the connection request can be received, and wirelessly transmits the measured monitoring data to the control unit 10. While the control unit 10 sequentially performs the first monitoring operation with the plurality of sensor units 20, the second monitoring operation to be described later is not performed.

As described above, for example, the lead-acid battery monitoring device executes the first monitoring operation once a day and acquires the voltage, the internal resistance, and the temperature from each lead-acid battery 1. Alternatively, in the first monitoring operation, the internal resistance and the temperature may be acquired from each lead-acid battery 1. Among the monitoring data, particularly the temperature has a large influence on the degradation and life of the lead-acid battery 1.

The temperature of the lead-acid battery 1 often fluctuates during one day due to the influence of environmental temperature or the like. It is expected that the estimation accuracy is enhanced by obtaining the average temperature of one day from the temperatures measured a plurality of times a day to estimate the degradation of each lead-acid battery 1 based on the average temperature rather than estimating the degradation of each lead-acid battery 1 based on the temperature measured once a day.

On the other hand, in order to measure the internal resistance, it is necessary to perform weak discharge from each lead-acid battery 1, and each lead-acid battery 1 discharges a plurality of times a day when the first monitoring operation is executed a plurality of times a day to measure the internal resistance together with the temperature. When the energy storage system is used as a backup power supply, because the plurality of lead-acid batteries 1 are constantly charged (for example, floating charge) from the power system, the lead-acid battery 1 is charged after weak discharge is performed for internal resistance measurement. Although it is weak, because discharge and charge are performed (cycling), it is assumed that the degradation of the lead-acid battery 1 progresses quickly when the number of measurement times of the internal resistance is increased.

Figure 8:
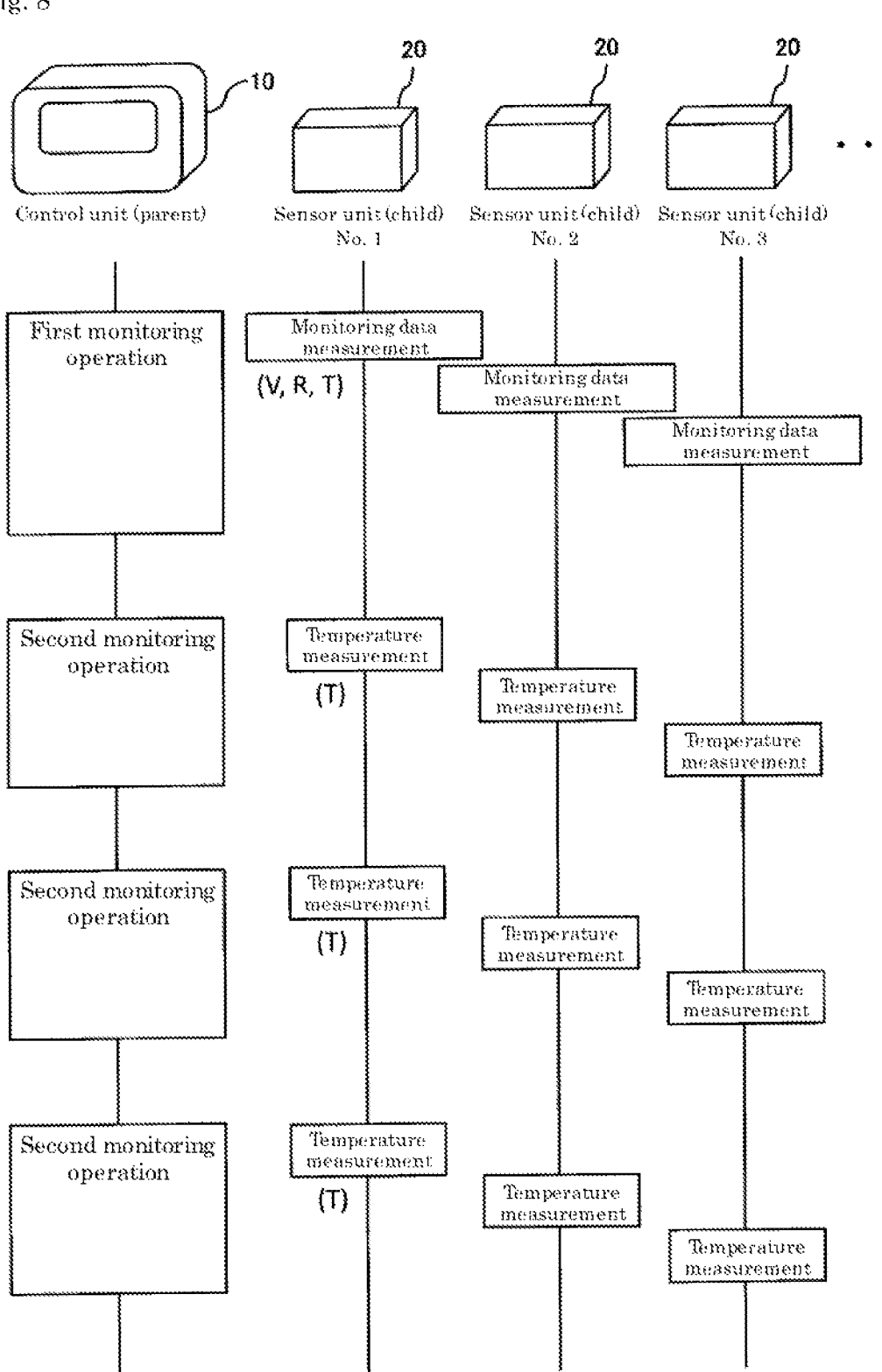
FIG. 8 is a view illustrating an example of a first monitoring operation and a second monitoring operation.

FIG. 8 illustrates a state in which the lead-acid battery monitoring device executes the first monitoring operation of measuring and acquiring the voltage, the internal resistance, and the temperature from each lead-acid battery 1 and the second monitoring operation of measuring and acquiring only the temperature from each lead-acid battery 1. In FIG. 8, the first monitoring operation is executed once a day, and the second monitoring operation is executed three times a day at timing different from execution timing of the first monitoring operation. The lead-acid battery monitoring device of the embodiment executes the second monitoring operation more times than the first monitoring operation at timing different from the execution timing of the first monitoring operation. The lead-acid battery monitoring device may continuously perform the second monitoring operation a plurality of times at intervals after performing the first monitoring operation once. For example, the lead-acid battery monitoring device executes the first monitoring operation once from 1:00 AM, and executes the second monitoring operation three times every six hours thereafter. The execution order of the first monitoring operation and the second monitoring operation is not limited to the example in FIG. 8. The lead-acid battery monitoring device may perform the first monitoring operation once, and consecutively perform the second monitoring operation twice at a time interval, or may consecutively perform the second monitoring operation four times or more at a time interval.

Figure 9:
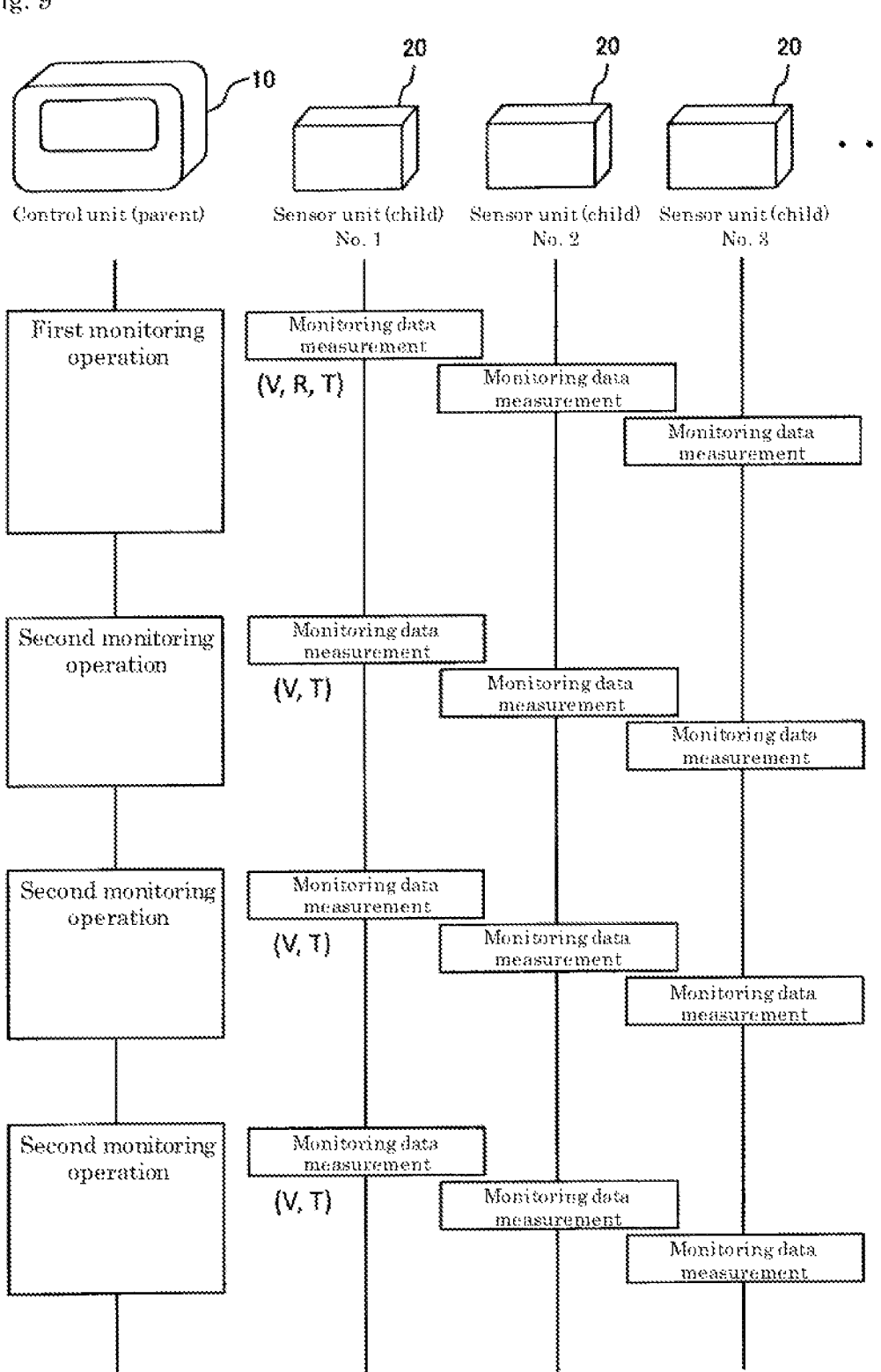
FIG. 9 is a view illustrating another example of the first monitoring operation and the second monitoring operation.

As illustrated in FIG. 9, the lead-acid battery monitoring device may measure and acquire the voltage and the temperature in the second monitoring operation. That is, the monitoring data of the lead-acid battery 1 other than the internal resistance is acquired in the second monitoring operation. The sensor unit 20 can transition to the sleep state earlier in the case of measuring only the temperature in the second monitoring operation as illustrated in FIG. 8 than in the case of FIG. 9.

FIGS. 8 and 9 illustrate an example in which the voltage, the internal resistance, and the temperature are acquired in the first monitoring operation. Alternatively, the internal resistance and the temperature may be acquired in the first monitoring operation.

With the above configuration, the measurement frequency of the temperature that greatly affects the degradation and life of the lead-acid battery 1 is increased while the measurement frequency of the internal resistance that requires the discharge of the lead-acid battery 1 is prevented, so that the state of the lead-acid battery 1 can be grasped with high accuracy.

When the large-scale energy storage system including hundreds of lead-acid batteries 1 is monitored, it takes a considerable time for the control unit 10 to sequentially connect to each sensor unit 20 through the wireless communication and acquire the monitoring data from all the lead-acid batteries 1. There is a possibility that the environmental temperature at the time when the temperature of the first lead-acid battery 1 is measured is different from the environmental temperature at the time when the temperature of the last lead-acid battery 1 is measured. When the temperature measurement is performed once a day, there is a possibility that it is erroneously determined that the progress of degradation of the lead-acid battery in which a high temperature is measured is fast. On the other hand, when temperature measurement is performed a plurality of times a day to perform degradation estimation using the average temperature of each lead-acid battery 1 on that day, it is expected that the estimation accuracy is improved.

The degradation estimation using the average temperature may be performed by the control unit 10. Alternatively, the monitoring data including the average temperature of each lead-acid battery 1 may be transmitted from the control unit 10 to the terminal of the maintenance staff through the third communication unit 53 (see FIG. 2), and the degradation estimation may be performed by the terminal of the maintenance staff. In addition, the monitoring data may be transmitted from the terminal of the maintenance staff to a remote information processing device (such as a remote monitoring server) connected to a network, and the degradation estimation may be performed by the information processing device.

An example in which the average temperature of each lead-acid battery 1 in a predetermined period (one day) is obtained and used for the degradation estimation has been described, but the predetermined period is not limited to one day. The average temperature may be calculated by the control unit 10 or may be calculated by the terminal of the maintenance staff or the remote information processing device.

The average temperature may be calculated by the control unit 10, and the average temperature and the measurement value every time may be stored in the storage 110 (see FIG. 2) as log data. In this way, in addition to the transition of the average temperature, the temperature transition in one day unit (predetermined period unit) can be checked and grasped.

An example in which each of the plurality of sensor units 20 executes the first monitoring operation of measuring the internal resistance and temperature of the lead-acid battery 1 to wirelessly transmit the measured internal resistance and temperature to the control unit 10 and the second monitoring operation of measuring the temperature of the lead-acid battery 1 to wirelessly transmit the measured temperature to the control unit 10 has been described. The measurement timing of each monitoring parameter is not limited to the example of the embodiment.

As described above, in order to measure the internal resistance, the weak discharge is required to be performed from each lead-acid battery 1. In the bank in which the plurality of lead-acid batteries 1 are connected in series, there is a possibility that the voltage of the other lead-acid battery 1 fluctuates (for example, the voltage rises) when the internal resistance of one lead-acid battery 1 is measured. This voltage fluctuation is a phenomenon caused by measuring the internal resistance of one lead-acid battery 1, and does not indicate that the state of other lead-acid batteries 1 fluctuates substantially. Normally, this voltage fluctuation is eliminated after a lapse of some time.

In order to avoid that the sensor unit 20 measures the voltage fluctuated by the internal resistance measurement and transmits the voltage to the control unit 10, monitoring parameters other than the internal resistance may be measured first, and then the internal resistance may be measured. That is, after the sensor unit 20 measures the voltage and temperature of the lead-acid battery 1 to transmit the voltage and temperature to the control unit 10, the sensor unit 20 may measure the internal resistance of the lead-acid battery 1 to transmit the internal resistance to the control unit 10. As long as the control unit 10 can receive the temperatures measured at more measurement time points than the measurement time points of the internal resistance as the monitoring data of each lead-acid battery 1, the measurement timing of each monitoring parameter can be arbitrarily set.

The invention claimed is:

1. A lead-acid battery monitoring device comprising:
a plurality of monitoring units, which are attached to a plurality of lead-acid batteries connected in series and/or in parallel, to measure monitoring data; and
a management unit that includes a processor and a storage storing a program causing the management unit to sequentially establish wireless communication connection with the plurality of monitoring units,
wherein the processor further executes the program to cause the management unit to perform:
a first monitoring operation in which the management unit sequentially receives monitoring data including an internal resistance and a temperature of each lead-acid battery from the plurality of monitoring units, wherein the wireless communication connection between the management unit and the monitoring unit that has sent the monitoring data to the management unit is disconnected, and
following the disconnection, a second monitoring operation in which the management unit sequentially receives monitoring data including the temperature of each lead-acid battery from the plurality of monitoring units.

2. The lead-acid battery monitoring device according to claim 1, wherein the second monitoring operation is executed at timing different from execution timing of the first monitoring operation.

3. The lead-acid battery monitoring device according to claim 1, wherein, in the second monitoring operation, each of the plurality of monitoring units measures only the temperature of the lead-acid battery and wirelessly transmits the temperature to the management unit.

4. The lead-acid battery monitoring device according to claim 1, wherein the lead-acid battery monitoring device estimates a degradation of the lead-acid battery using an average temperature of a predetermined period obtained from temperatures at a plurality of time points of the each lead-acid battery.

5. A lead-acid battery monitoring method, performed by a management unit that includes a processor and a storage storing a program causing the management unit to execute steps comprising:
sequentially wirelessly communicating with a plurality of monitoring units, which are attached to a plurality of lead-acid batteries connected in series and/or in parallel;
executing a first monitoring operation in which the management unit sequentially receives monitoring data including an internal resistance and a temperature of each lead-acid battery from the plurality of monitoring units, wherein the wireless communication connection between the management unit and the monitoring unit that has sent the monitoring data to the management unit is disconnected; and
following the disconnection, executing a second monitoring operation in which the management unit sequentially receives monitoring data including the temperature of each lead-acid battery from the plurality of monitoring units.

6. The lead-acid battery monitoring method according to claim 5, wherein, in the second monitoring operation, each of the plurality of monitoring units measures only the temperature of the lead-acid battery and wirelessly transmits the temperature to the management unit.

7. The lead-acid battery monitoring method according to claim 5, wherein the lead-acid battery monitoring device estimates a degradation of the lead-acid battery using an average temperature of a predetermined period obtained from temperatures at a plurality of time points of the each lead-acid battery.

8. A lead-acid battery monitoring device comprising:
a plurality of monitoring units, which are attached to a plurality of lead-acid batteries connected in series and/or in parallel, to measure monitoring data; and
a management unit that includes a processor and a storage storing a program causing the management unit to sequentially establish wireless communication connection with the plurality of monitoring units,
wherein the processor further executes the program to cause the management unit to perform:
a first monitoring operation in which the management unit sequentially receives monitoring data including an internal resistance and a temperature of each lead-acid battery from the plurality of monitoring units, wherein the wireless communication connection between the management unit and the monitoring unit that has sent the monitoring data to the management unit is disconnected, and
following the disconnection, a second monitoring operation in which the management unit sequentially receives monitoring data including the temperature of each lead-acid battery from the plurality of monitoring units, and
wherein:
the second monitoring operation is executed at timing different from execution timing of the first monitoring operation, and
the lead-acid battery monitoring device estimates a degradation of the lead-acid battery using an average temperature of a predetermined period obtained from temperatures at a plurality of time points of the each lead-acid battery.

\* \* \* \* \*